US010714327B2

(12) United States Patent
Bezel et al.

(10) Patent No.: US 10,714,327 B2
(45) Date of Patent: Jul. 14, 2020

(54) SYSTEM AND METHOD FOR PUMPING LASER SUSTAINED PLASMA AND ENHANCING SELECTED WAVELENGTHS OF OUTPUT ILLUMINATION

(71) Applicant: KLA-Tencor Corporation, Milpitas, CA (US)

(72) Inventors: Ilya Bezel, Mountain View, CA (US); Anatoly Shchemelinin, Bozeman, MT (US); Eugene Shifrin, Sunnyvale, CA (US); Matthew Derstine, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/283,379

(22) Filed: Feb. 22, 2019

(65) Prior Publication Data
US 2019/0287785 A1    Sep. 19, 2019

Related U.S. Application Data

(60) Provisional application No. 62/644,968, filed on Mar. 19, 2018.

(51) Int. Cl.
*H01J 61/02* (2006.01)
*G02B 27/14* (2006.01)
(Continued)

(52) U.S. Cl.
CPC ............ *H01J 61/025* (2013.01); *G01N 21/55* (2013.01); *G01N 23/04* (2013.01); *G02B 27/141* (2013.01);
(Continued)

(58) Field of Classification Search
CPC ...... H01J 61/025; H01J 65/042; G01N 21/55; G01N 23/04; G01N 2021/556; G02B 27/141
(Continued)

(56) References Cited

U.S. PATENT DOCUMENTS 5,608,526 A   3/1997 Piwonka-Corle et al.
5,999,310 A   12/1999 Shafer et al.
(Continued)

OTHER PUBLICATIONS

International Search Report dated Jul. 2, 2019 for PCT/US2019/022654.

*Primary Examiner* — Roy M Punnoose
(74) *Attorney, Agent, or Firm* — Suiter Swantz pc llo

(57) ABSTRACT

A system for pumping laser sustained plasma and enhancing one or more selected wavelengths of output illumination generated by the laser sustained plasma is disclosed. In embodiments, the system includes one or more pump modules configured to generate pump illumination for the laser sustained plasma and one or more enhancing illumination sources configured to generate enhancing illumination at one or more selected wavelengths. The pump illumination may be directed along one or more pump illumination paths that are non-collinear to an output illumination path of the output illumination. The enhancing illumination may be directed along an illumination path that is collinear to the output illumination path of the output illumination so that the enhancing illumination is combined with the output illumination, thereby enhancing the output illumination at the one or more selected wavelengths.

44 Claims, 12 Drawing Sheets

(51) Int. Cl.
*H01J 65/04* (2006.01)
*G01N 21/55* (2014.01)
*G01N 23/04* (2018.01)

(52) U.S. Cl.
CPC ...... *H01J 65/042* (2013.01); *G01N 2021/556* (2013.01)

(58) Field of Classification Search
USPC ........................................... 362/259
See application file for complete search history.

(56) References Cited

U.S. PATENT DOCUMENTS

| | | | |
|---|---|---|---|
| 6,297,880 B1 | 10/2001 | Rosencwaig et al. | |
| 7,435,982 B2 | 10/2008 | Smith | |
| 7,525,649 B1 | 4/2009 | Leong et al. | |
| 7,786,455 B2 | 8/2010 | Smith | |
| 8,618,254 B2 | 12/2013 | Giaccia et al. | |
| 9,099,292 B1 | 8/2015 | Bezel et al. | |
| 9,185,788 B2 | 11/2015 | Bezel et al. | |
| 9,318,311 B2 | 4/2016 | Chimmalgi et al. | |
| 9,615,439 B2 | 4/2017 | Bezel et al. | |
| 9,741,553 B2* | 8/2017 | Blondia | H01J 61/025 |
| 9,775,226 B1 | 9/2017 | Bezel et al. | |
| 9,927,094 B2 | 3/2018 | Bezel et al. | |
| 10,032,620 B2* | 7/2018 | Wilson | H01J 61/302 |
| 2004/0264512 A1* | 12/2004 | Hartlove | H05G 2/003 372/5 |
| 2007/0002465 A1 | 1/2007 | Chuang et al. | |
| 2007/0228300 A1* | 10/2007 | Smith | H01J 61/025 250/504 R |
| 2009/0032740 A1* | 2/2009 | Smith | B82Y 10/00 250/503.1 |
| 2009/0180176 A1 | 7/2009 | Armstrong et al. | |
| 2011/0291566 A1 | 12/2011 | Bezel et al. | |
| 2013/0114085 A1 | 5/2013 | Wang et al. | |
| 2014/0239202 A1* | 8/2014 | Bezel | H01J 61/025 250/503.1 |
| 2014/0239795 A1* | 8/2014 | Kim | H01J 61/025 313/111 |
| 2015/0271905 A1* | 9/2015 | Oh | H01J 65/00 250/432 R |
| 2015/0333471 A1 | 11/2015 | Chimmalgi et al. | |
| 2016/0381776 A1 | 12/2016 | Derstine et al. | |
| 2017/0150590 A1 | 5/2017 | Chimmalgi et al. | |
| 2017/0278694 A1 | 9/2017 | Chuang et al. | |

* cited by examiner

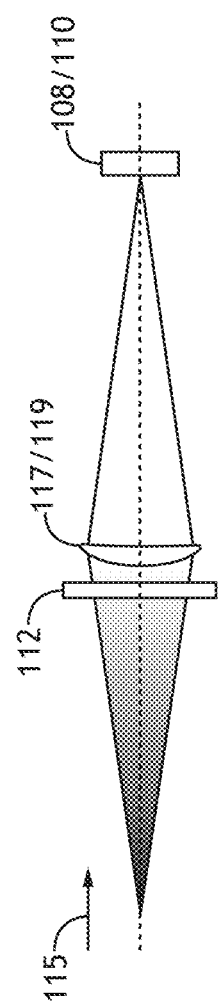
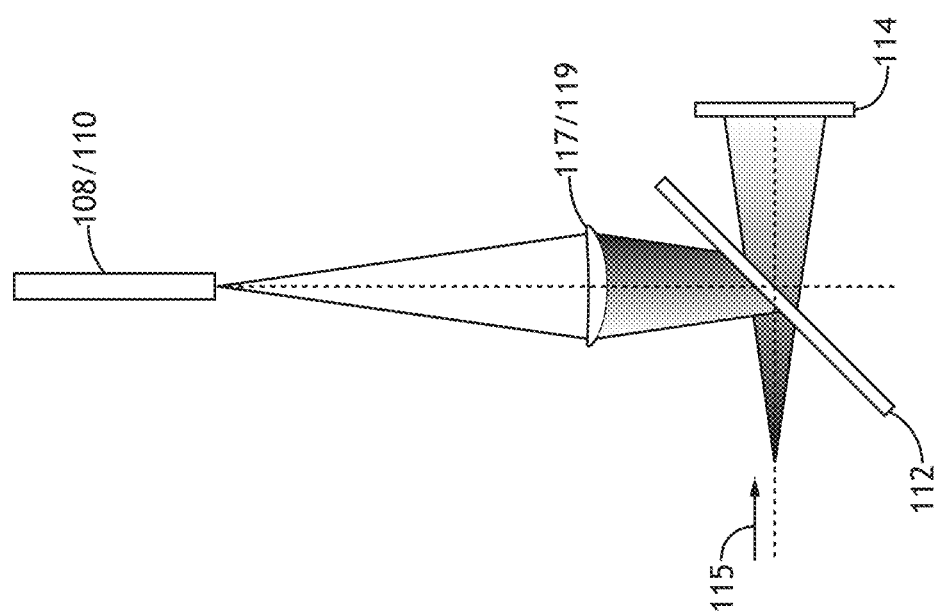
FIG. 4A
FIG. 4B

SYSTEM AND METHOD FOR PUMPING LASER SUSTAINED PLASMA AND ENHANCING SELECTED WAVELENGTHS OF OUTPUT ILLUMINATION

CROSS-REFERENCE TO RELATED APPLICATIONS

The present application claims priority to U.S. Provisional Application Ser. No. 62/644,968, filed Mar. 19, 2018 and titled "Enhanced IR Multipump Laser-Sustained Plasma Light Source," with inventors Ilya Bezel, Anatoly Shchemelinin, Eugene Shifrin, and Matthew Derstine, which is incorporated herein by reference in its entirety.

TECHNICAL FIELD

The present disclosure relates generally to illumination sources and more particularly to laser sustained plasma (LSP) sources.

BACKGROUND

Laser sustained plasmas (LSPs) are used as broadband light sources in a variety of applications including wafer inspection and metrology. Some of the existing LSP illumination systems may experience difficulty in meeting specific power/radiance requirements for metrology and inspection applications. For example, LSP illumination systems may have limited brightness in broadband red and infrared (IR) spectral ranges. Brightness of LSP sources in the red and IR spectral ranges is limited by black-body emission limit. The black-body IR emission does not increase much with plasma temperature, leading to spectral radiance that struggles to exceed about 0.2 W/mm$^2$/srad/nm in most practical cases, while the spectral radiance in ultraviolet (UV) ranges may exceed about 2 W/mm$^2$/srad/nm. The plasma radiance is even lower in deeper IR ranges. Moreover, for most gases used in LSP, absorptivity in the IR range is higher than in the visible (VIS) to UV spectral ranges. When trying to achieve higher radiance in VIS to UV ranges, the gas density is increased to increase emissivity. Plasma absorptivity in the IR reaches the black-body limit very quickly (especially on the absorption lines) and colder plasma periphery absorbs emission from a hotter core, leading to an effective limit on the plasma radiance in the IR range corresponding to lower temperatures than the plasma core.

Some LSP illumination systems are also impeded by limited spectral width of the laser sources. When laser sources are used, their radiance can be very high and not limited by black body. However, the laser sources are narrow-band and cannot be used in applications where broadband is preferable. Similarly, only a few laser wavelengths are available in the VIS-UV-DUV spectral ranges.

Furthermore, imbalance of spectral radiance can occur in LSP illumination systems that employ combined illumination from LSP and laser sources. In some versions, light collection from the plasma can be designed to occur collinearly with the pump laser. In this case, the laser wavelengths that are transmitted through LSP are added to the collected spectrum to form a narrowband line corresponding to the spectral radiance contributed by the laser source. However, for the pump powers required to sustain the plasma and for typical plasma transmission of about 20% for most absorptive cases, the spectral radiance of the transmitted laser radiation exceeds plasma radiance by orders of magnitude. In order to make the plasma brighter, higher pump power is required and the balance of spectral brightness is never achieved.

There is a need for improved LSP technologies to generate broadband illumination that meets power/radiance requirements at all applicable spectral ranges.

SUMMARY

A system for pumping laser sustained plasma and enhancing one or more selected wavelengths of output illumination generated by the laser sustained plasma is disclosed, in accordance with one or more illustrative embodiments of this disclosure. In one illustrative embodiment, the system includes one or more pump modules configured to generate pump illumination for the laser sustained plasma and one or more enhancing illumination sources configured to generate enhancing illumination at one or more selected wavelengths. The pump illumination may be directed along one or more pump illumination paths that are non-collinear to an output illumination path of the output illumination. The enhancing illumination may be directed along an illumination path that is collinear to the output illumination path of the output illumination so that the enhancing illumination is combined with the output illumination, thereby enhancing the output illumination at the one or more selected wavelengths.

A system for generating broadband illumination is also disclosed, in accordance with one or more illustrative embodiments of this disclosure. In one illustrative embodiment, the system includes a plasma forming material and one or more pump modules configured to generate pump illumination. The system may include one or more optical elements configured to direct the pump illumination to the plasma forming material, whereby the pump illumination causes the plasma forming material to generate a laser sustained plasma that emits broadband illumination. The pump illumination may be directed along one or more pump illumination paths that are non-collinear to an output illumination path of the broadband illumination. In embodiments, the system further includes one or more enhancing illumination sources configured to generate enhancing illumination at one or more selected wavelengths. The enhancing illumination may be directed along an illumination path that is collinear to the output illumination path of the output illumination so that the enhancing illumination is combined with the output illumination, thereby enhancing the output illumination at the one or more selected wavelengths.

A method of generating broadband illumination is also disclosed, in accordance with one or more illustrative implementations of the present disclosure. In one illustrative implementation, the method includes: generating pump illumination with one or more pump modules; directing the pump illumination to a plasma forming material, whereby the pump illumination causes the plasma forming material to generate a laser sustained plasma that emits broadband illumination, wherein the pump illumination is directed along one or more pump illumination paths that are non-collinear to an output illumination path of the broadband illumination; generating enhancing illumination at one or more selected wavelengths with one or more enhancing illumination sources; and directing the enhancing illumination along an illumination path that is collinear to the output illumination path of the broadband illumination so that the enhancing illumination is combined with the broadband illumination, thereby enhancing the broadband illumination at the one or more selected wavelengths.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 4A is a schematic illustration of a portion of a LSP illumination system, such as the LSP illumination system illustrated in FIG. 3A, that includes one or more blocking filters configured to prevent at least a portion of the output illumination from being redirected to the one or more pump modules or to the one or more enhancing illumination sources, in accordance with one or more embodiments of the present disclosure;

FIG. 4B is a schematic illustration of a portion of a LSP illumination system, such as the LSP illumination system illustrated in FIG. 3A, that includes one or more blocking filters configured to prevent at least a portion of the output illumination from being redirected to the one or more pump modules or to the one or more enhancing illumination sources, in accordance with one or more embodiments of the present disclosure;

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Figure 1A:
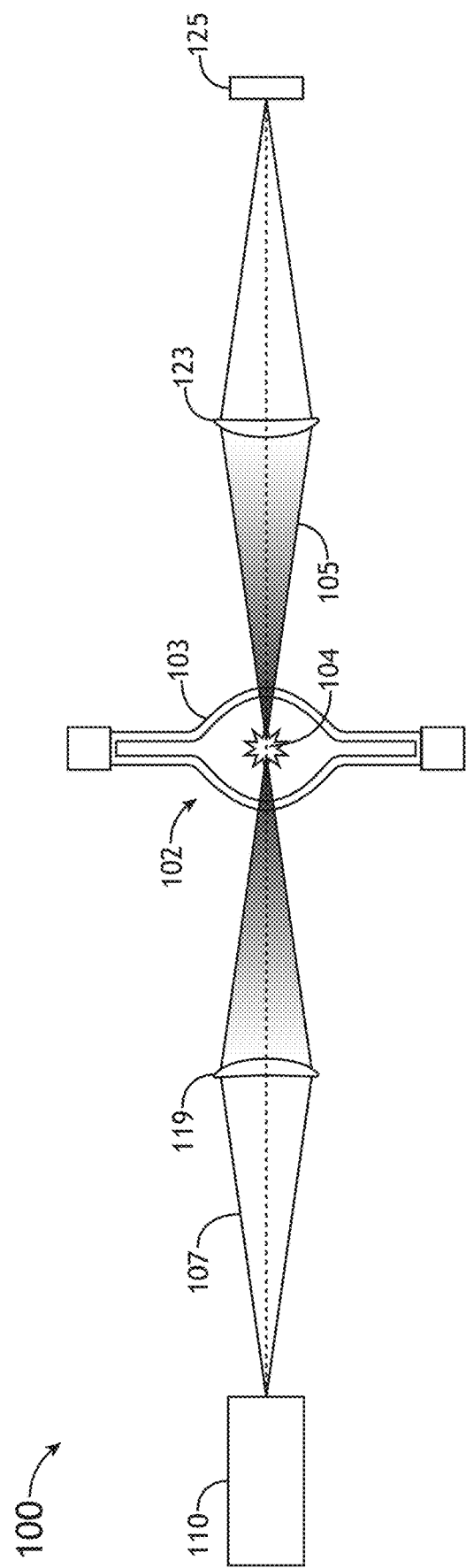
FIG. 1A is a schematic illustration of a laser sustained plasma (LSP) illumination system, in accordance with one or more embodiments of the present disclosure.
Figure 1B:
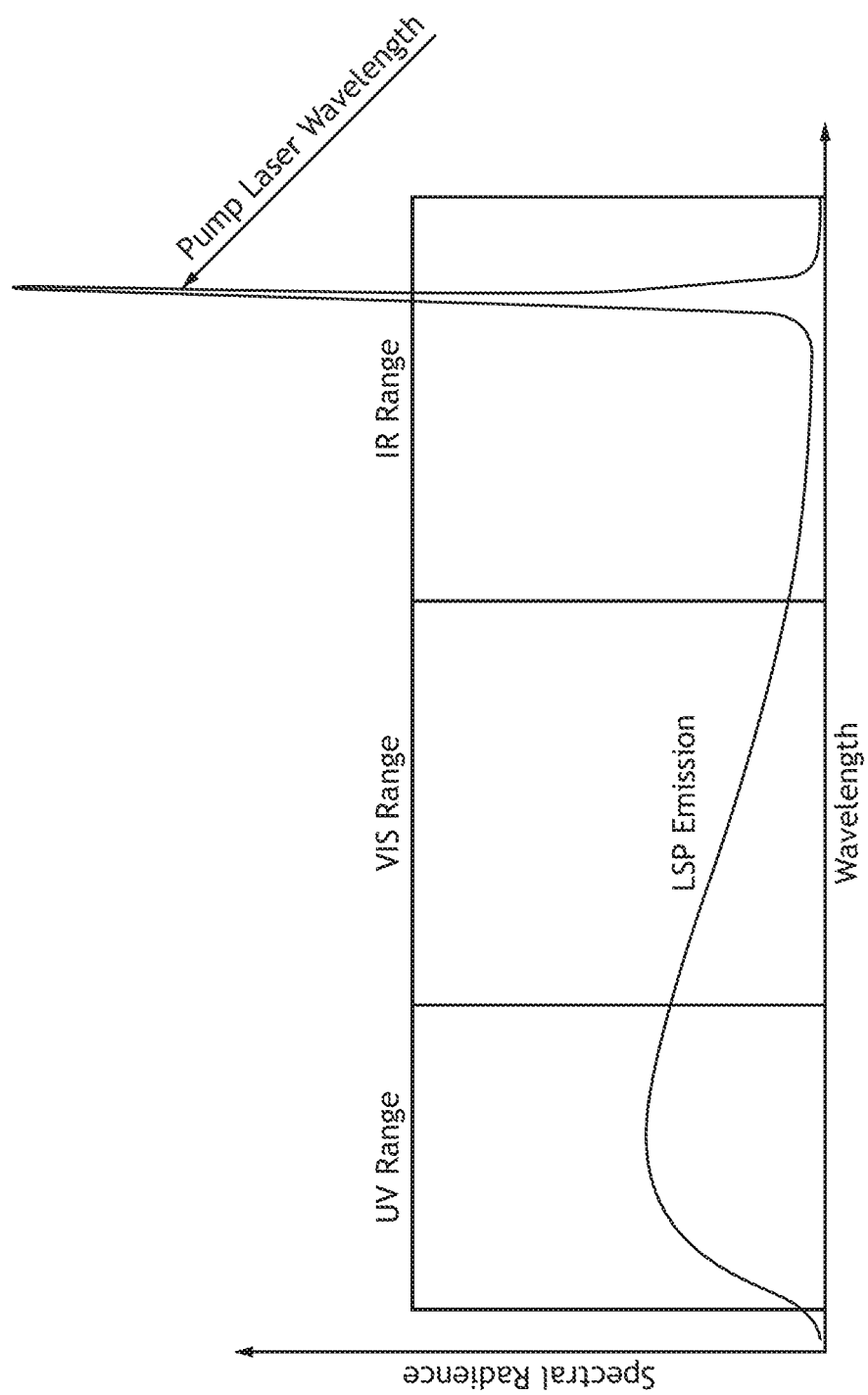
FIG. 1B is an example of a graphical plot of the spectral radiance of output illumination from a LSP illumination system, such as the LSP illumination system illustrated in FIG. 1A.
Figure 2A:
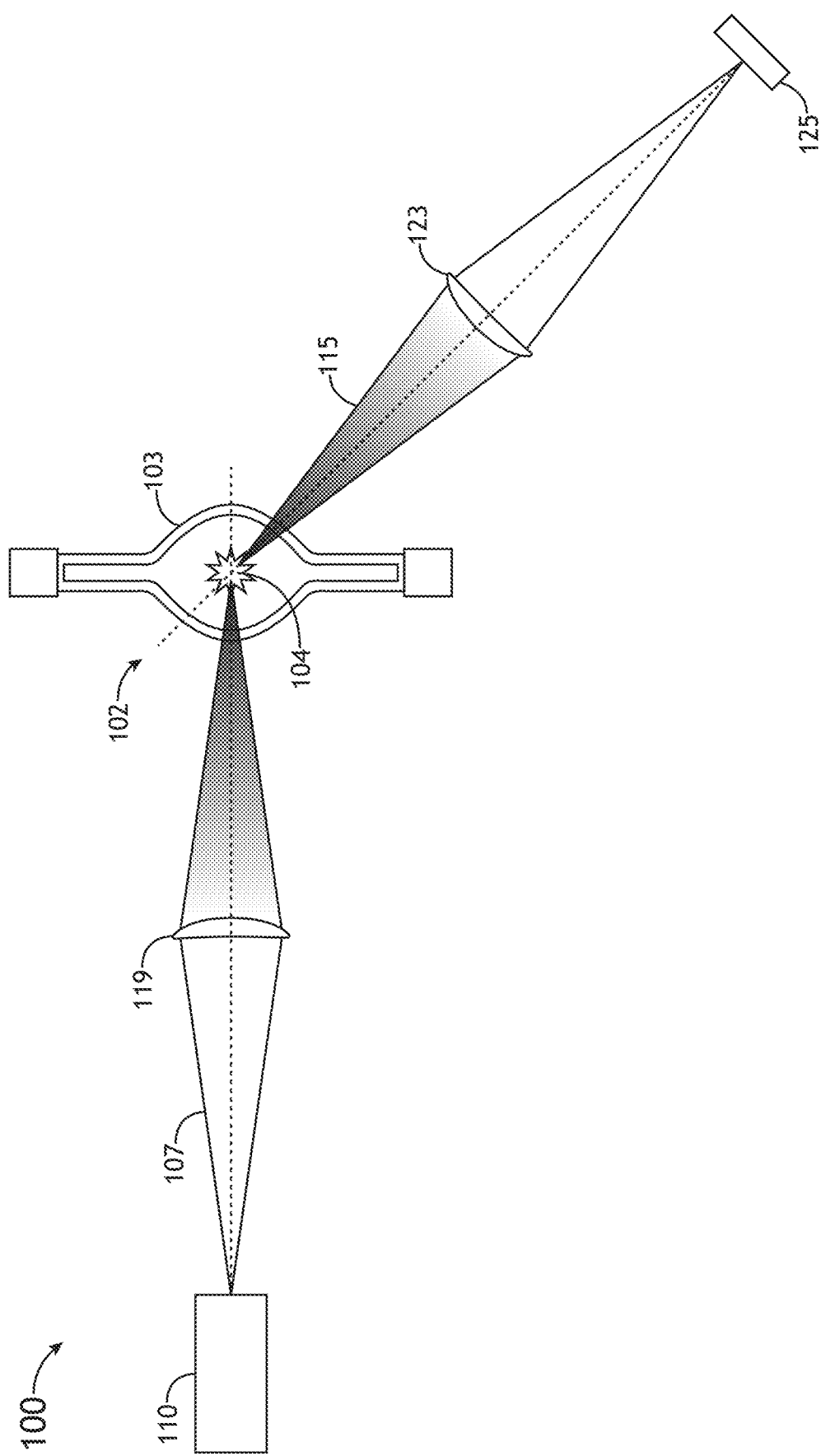
FIG. 2A is a schematic illustration of a LSP illumination system, in accordance with one or more embodiments of the present disclosure.
Figure 2B:
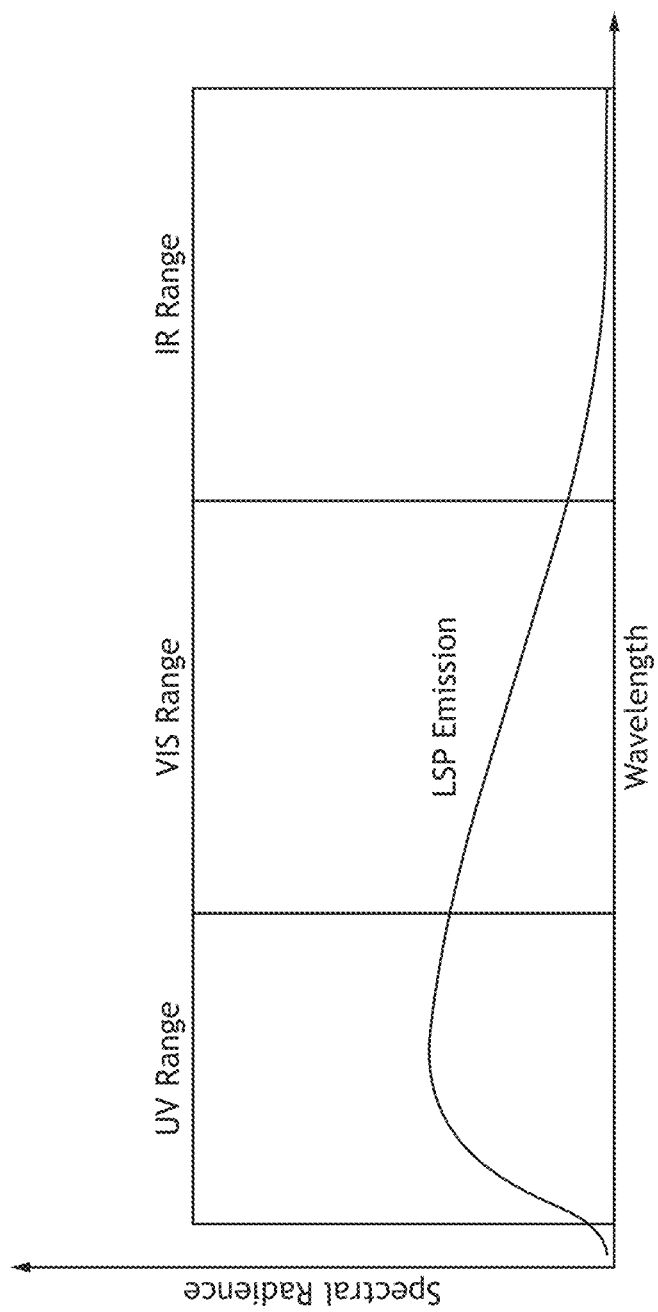
FIG. 2B is an example of a graphical plot of the spectral radiance of output illumination from a LSP illumination system, such as the LSP illumination system illustrated in FIG. 2A.

Laser sustained plasmas (LSPs) are used as broadband light sources in a variety of applications including wafer inspection and metrology. In some embodiments, a LSP illumination system may include a single pump module (e.g., a pump laser source) with the direction of collection in either collinear or noncollinear geometry, for example, as shown in FIGS. 1A and 2A, respectively. In a collinear arrangement (e.g., as illustrated in FIG. 1A), the collected light includes LSP radiation and laser radiation. As can be seen in FIG. 1B, in such a configuration, the laser power/radiance of the pump laser that is required to sustain the LSP results in a disproportionally high peak in the collected spectral radiance. In a non-collinear arrangement (e.g., as illustrated in FIG. 2A), the collected light includes LSP radiation only. As can be seen in FIG. 2B, in such a configuration, the LSP spectral radiance in certain spectral ranges (e.g., infrared (IR)) may be much weaker than the LSP spectral radiance in other spectral ranges (e.g., visible (VIS) and ultraviolet (UV)).

Referring generally to FIGS. 1A through 8, systems and methods for pumping laser sustained plasma and enhancing one or more selected wavelengths of output (e.g., broadband) illumination generated by the laser sustained plasma are disclosed, in accordance with illustrative embodiments of this disclosure. In embodiments, the system includes one or more pump modules configured to generate pump illumination for the laser sustained plasma. The pump illumination may be directed along one or more pump illumination paths that are non-collinear to an output illumination path of the output illumination. The use of a single high power or multiple pump laser sources in non-collinear arrangement may serve to sustain the LSP and increase the broadband spectral radiance that it generates. In some embodiments, the system further includes one or more enhancing illumination sources configured to generate enhancing illumination at one or more selected wavelengths (e.g., in the IR range or any other selected spectral range). The enhancing illumination may be directed along an illumination path that is collinear to the output illumination path of the output illumination so that the enhancing illumination is combined with the output illumination, thereby enhancing the output illumination at the one or more selected wavelengths. In some embodiments, the one or more enhancing illumination sources include lasers combined with close enough spectral spacing as to form a continuous spectrum of enhancing illumination.

FIG. 3A through 5B illustrate embodiments of a LSP illumination system 100 for generating broadband illumination by forming and/or sustaining LSP. The generation of plasma is generally described in U.S. Pat. No. 7,786,455, granted on Aug. 31, 2010; and U.S. Pat. No. 7,435,982, granted on Oct. 14, 2008, which are incorporated herein by reference in their entirety. Various plasma cell designs and plasma control mechanisms are described in U.S. Pat. No. 9,318,311, granted on Apr. 19, 2016, which is incorporated herein by reference in the entirety. The generation of plasma is also generally described in U.S. Pat. No. 9,615,439, granted on Apr. 4, 2017, which is incorporated by reference herein in the entirety. Plasma cell and control mechanisms are also described in U.S. Pat. No. 9,775,226, granted on Sep. 26, 2017, which is incorporated by reference herein in the entirety. Plasma cell and control mechanisms are also described in U.S. Pat. No. 9,185,788, granted on Nov. 10, 2015, which is incorporated by reference herein in the entirety. Plasma cell and control mechanisms are also described in U.S. Pat. No. 9,927,094, granted on Mar. 27, 2018, which is incorporated by reference herein in the entirety. In a general sense, the system 100 should be interpreted to extend to any plasma (e.g., LSP) based illumination source known in the art.

In embodiments, the system 100 includes one or more pump modules 110 configured to generate pump illumination 107 of a selected wavelength, or wavelength range, such as, but not limited to, infrared (IR) illumination, visible (VIS) illumination, or ultraviolet (UV) illumination. In some embodiments, a pump module 110 may be configured to generate illumination 107 having a frequency (or frequency band) in the range of 3 terahertz (THz) to 3 petahertz (PHz) and/or a wavelength (or range of wavelengths) in the range of in the range of 100 nanometers (nm) to 100 micrometers (μm). For example, the one or more pump modules 110 may be configured to emit pump illumination 107 in the IR and/or VIS spectral ranges. In another example, the one or more pump modules 110 may be configured to emit pump illumination 107 in the UV spectral range.

Each pump module 110 may include one or more lasers. In a general sense, the pump module 110 may include any laser system known in the art. For instance, the pump module 110 may include any laser system known in the art capable of emitting illumination in the infrared, visible or ultraviolet portions of the electromagnetic spectrum. In embodiments, a pump module 110 may include a laser system configured to emit continuous wave (CVV) illumination, configured to emit pulsed illumination, or configured to selectively emit CW or pulsed illumination (e.g., based upon a selected mode of the pump module 110). For example, the pump module 110 may include, but is not limited to, a Yb or Yt fiber laser, a Yb or Yt disk laser, Nd:YAG solid state laser, Nd:YLF laser, or the like. In other embodiments, the pump module 110 may include one or more non-laser sources. For example, the pump module 110 may include any non-laser illumination source known in the art, such as a non-laser system capable of emitting illumination discretely or continuously in the infrared, visible or ultraviolet portions of the electromagnetic spectrum. In some embodiments, the system 100 may include a plurality of pump modules 110 (e.g., pump modules 110A, 110B, 110C, 110D) configured to generate pump illumination (e.g., illumination 107A, 107B, 107C, 107D) that is directed at the plasma 104 or at plasma-forming material (to generate plasma 104).

It is contemplated that a plasma 104 (e.g., LSP) can be sustained by a train of such short pulses provided that the repetition rate of these pulses is higher than the inverse time of plasma decay. Typically, it takes about a microsecond to extinguish LSP. Thus, in some embodiments, the pump module 110 is configured to emit pulsed illumination with a 1 megahertz (MHz) or higher repetition rate to ensure that the next pump pulse arrives to the plasma 104 before it has a chance to go off. In other embodiments, the repetition rate of the pulsed illumination source is at least 200 kilohertz. In some embodiments, the repetition rate of the pulsed illumination source is in the range of 1 megahertz to 1000 megahertz. In some embodiments, a pulse duration of the pulsed illumination source is in the range of 1 picosecond to 1000 picoseconds. In an embodiment, the pump module 110 is a mode-locked Nd:YAG laser with about 100 MHz repetition rate and about 100 picosecond pulse. These examples are provided for illustrative purposes and are not intended as limitations of the present disclosure unless otherwise provided herein.

Figure 3A:
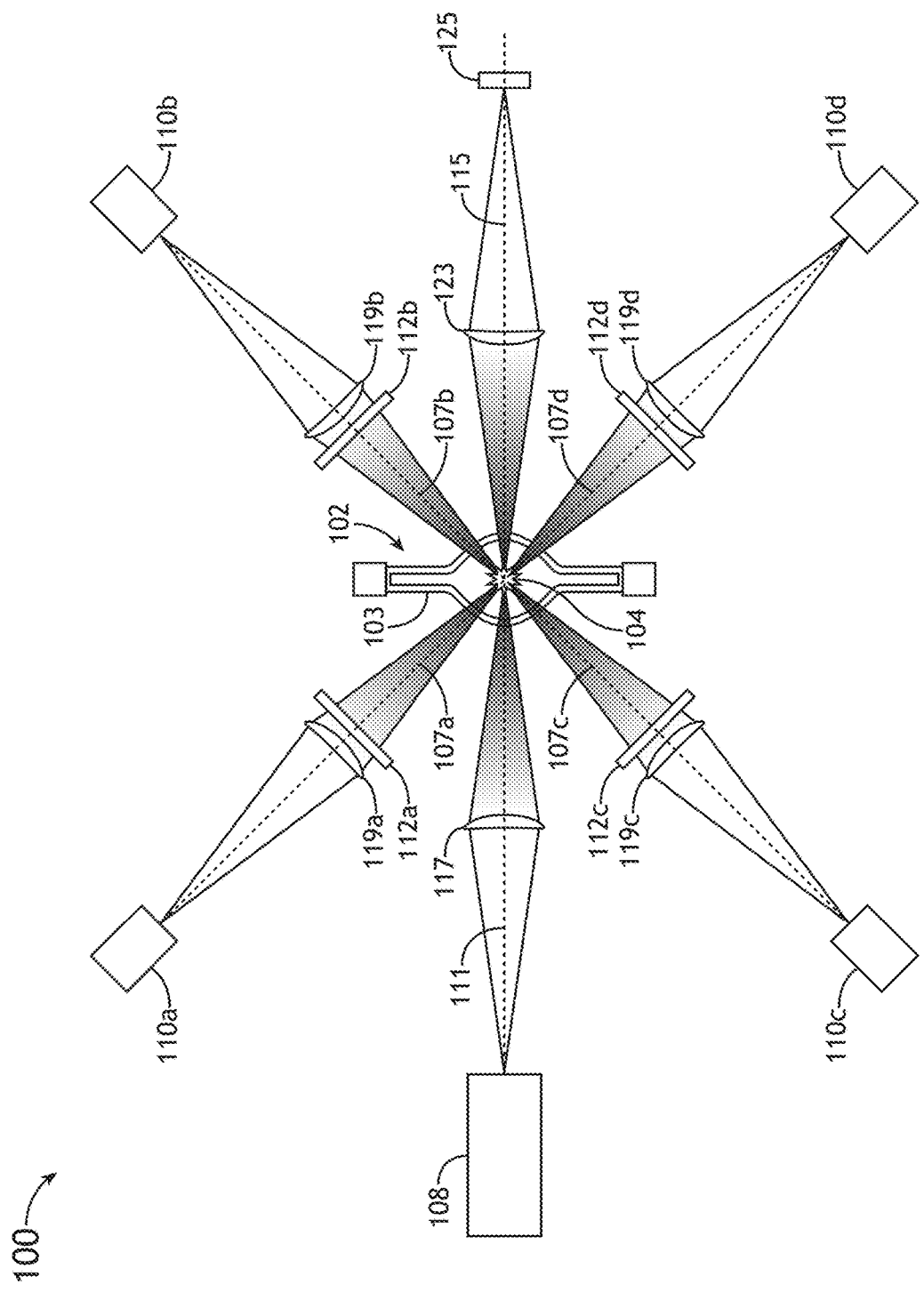
FIG. 3A is a schematic illustration of a LSP illumination system that includes one or more pump modules and one or more enhancing illumination sources, in accordance with one or more embodiments of the present disclosure.

A pump module 110 may include, but is not limited to, a laser light source (e.g., a diode laser, fiber laser, fiber-coupled diode laser, free-range laser, or the like) and can also include or can be aligned with a set of optics 119 that shapes and focuses the laser light into or in the vicinity of the plasma 104. For example, as shown in FIG. 3A, pump modules 110a, 110b, 110c, and 110d may have respective optics 119a, 119b, 119c, and 119d configured to shape the focus pump illumination 107a, 107b, 107c, and 107d into or in proximity to the plasma 104.

In some embodiments, such as the embodiment illustrated in FIG. 4A, a pump module 110 can also at least one blocking filter 112 configured to prevent at least a portion of the output illumination 115 (e.g., broadband illumination generated by the plasma 104) from being redirected back into the pump module 110. For example, as shown in FIG. 3A, pump modules 110a, 110b, 110c, and 110d may have respective blocking filters 112a, 112b, 112c, and 112d configured to prevent at least a portion of the output illumination 115 from being redirected back into the pump modules 110a, 110b, 110c, and 110d. The one or more blocking filters 112 can prevent output illumination 115 generated by the plasma 104 from coupling back into the one or more pump modules 110 and causing performance degradation, for example, due to photo-induced or thermal damage. In some embodiments, a blocking filter 112 may include a reflective dichroic filter configured to transmit one or more wavelengths of pump illumination 107 and reflect plasma radiation or configured to transmit plasma radiation and reflect pump illumination 107. Alternatively or additionally, a blocking filter 112 may include an absorptive filter (e.g., a gold-coated mirror that efficiently absorbs UV or another selected spectral range). FIG. 4A illustrates an embodiment where the blocking filter 112 is configured to transmit pump illumination 107 toward the plasma 104 and is configured to block (e.g., reflect) at least a portion of the output illumination 115 (e.g., broadband plasma radiation) so that it does not reach the pump module 110. Another embodiment is shown in FIG. 4B, where the blocking filter 112 is configured to reflect pump illumination 107 (e.g., to direct the pump illumination 107 toward the plasma 104), and the blocking filter 112 is configured to transmit at least a portion of the output illumination 115 (e.g., broadband plasma radiation) so that it does not reach the pump module 110. In the FIG. 4B configuration, the blocking filter 112 may be configured to transmit the output illumination 115 (or a portion thereof) into a beam block 114 that absorbs the illumination or otherwise removes it from the system 100.

The system 100 may further include one or more enhancing illumination sources 108 configured to generate enhancing illumination 111 at one or more selected wavelengths (e.g., IR and/or VIS wavelengths). In some embodiments, the one or more enhancing illumination sources 108 are configured to generate illumination 111 at one or more selected wavelengths or selected bands of wavelengths in the range of 600 nm to 2000 nm. In other embodiments, the enhancing illumination 111 may have selected wavelengths/bands in other spectral ranges (e.g., UV and/or other spectra).

In embodiments, the pump illumination 107 may be directed along one or more pump illumination paths that are non-collinear to an output illumination path of the output illumination 115. For example, the one or more pump modules 110, or their respective pump illumination paths, may be non-collinear to (e.g., angled with respect to) the output illumination path of the output (e.g., broadband) illumination 115 generated by the plasma 104. Meanwhile, the enhancing illumination 111 may be directed along an illumination path that is collinear to (e.g., along the same axis as) the output illumination path of the output illumination 115 so that the enhancing illumination 111 can be combined with the output illumination 115, thereby enhancing the output illumination 115 at the one or more selected wavelengths.

An enhancing illumination source 108 may include, but is not limited to, a laser light source (e.g., a diode laser, fiber laser, fiber-coupled diode laser, free-range laser, or the like), a multi-wavelength and/or multi-color illumination source, a plurality of singe-wavelength and/or narrowband illumination sources, or a broadband illumination source. Various wavelengths can be used for enhancing illumination 111. In this regard, the one or more enhancing illumination sources 108 may include at least one multiple-wavelength diode laser, CW laser, a pulsed laser, a free-standing laser, a supercontinuum laser, and/or a separate laser sustained plasma light source. For example, in an embodiment, the one or more enhancing illumination sources 108 include a multi-wavelength illumination source. In another embodiment, the one or more enhancing illumination sources 108 include a plurality of single or multiple wavelength illumination sources coupled into a common optical fiber. In another embodiment, the one or more enhancing illumination sources 108 include a plurality of single or multiple wavelength illumination sources combined onto dichroic optics or in numerical aperture (NA) space.

Figure 3B:
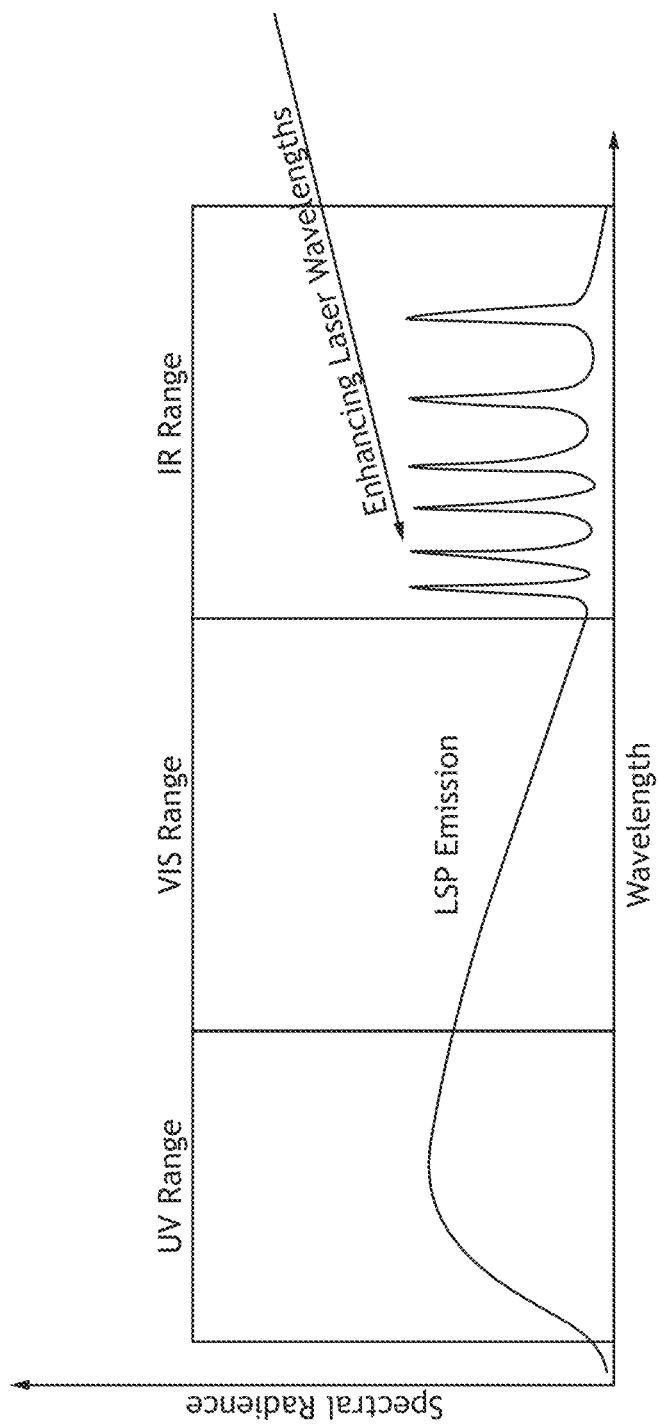
FIG. 3B is an example of a graphical plot of the spectral radiance of output illumination from a LSP illumination system that includes one or more pump modules and one or more enhancing illumination sources, such as the LSP illumination system illustrated in FIG. 3A.

The enhancing illumination source 108 can also include or can be aligned with a set of optics 117 that shapes and focuses the laser light into or in the vicinity of the plasma 104 and/or along the output illumination path. In embodiments, the enhancing illumination source 108 allows for an increase of collected plasma radiance at one or more specific wavelengths in a controlled manner, independent of the plasma sustainability requirements. The enhancing illumination 111 may be lower radiance/intensity than the pump illumination 107 so that the output illumination 115 does not have a very large spike in spectral radiance (e.g., as shown in FIG. 1B) and is instead enhanced at the one or more selected wavelengths with increased spectral radiance that is applied more uniformly (e.g., as shown in FIG. 3B). For example, the one or more enhancing illumination sources 108 may be configured to generate enhancing illumination 111 with spectral radiance at the one or more selected wavelengths that is not more than 50% greater than a peak spectral radiance of the unmodified output illumination (i.e., the output illumination 115 without the enhancing illumination 111). In some embodiments, the one or more enhancing illumination sources 108 include at least one broadband light source or a plurality of single/multiple wavelength sources (e.g., lasers) combined with close enough spectral spacing as to form a continuous spectrum of enhancing illumination (e.g., in the VIS and/or IR spectral ranges).

In some embodiments, the enhancing illumination source 108 may be configured to both sustain the plasma (e.g., assist the pump modules 110 in pumping the plasma) and improve spectral radiance at the one or more selected wavelengths. For example, the enhancing illumination 111 may be directed at or in proximity to the plasma 104 and, in some embodiments, may be combined with (e.g., integrated into) the output illumination 115 via plasma coupling or any other type of optical coupling at or near the plasma 104. In other embodiments, the enhancing illumination 111 may be combined with the output illumination 115 downstream from the plasma 104 (e.g., by fiber coupling or any other type of optical coupling technique).

Although FIG. 3A illustrates an embodiment of the system 100 including one enhancing illumination source 108, in other embodiments, the system 100 can include a plurality of enhancing illumination sources 108 that are configured to direct enhancing illumination 111 along one or more illumination paths that are collinear to the output illumination path of the output illumination 115.

In some embodiments, such as the embodiment illustrated in FIG. 4A, an enhancing illumination source 108 can also include at least one blocking filter 112 configured to prevent at least a portion of the output illumination 115 (e.g., broadband illumination generated by the plasma 104) from being redirected back into the pump module 110. The blocking filter 112 can prevent output illumination 115 generated by the plasma 104 from coupling back into the enhancing illumination source 108 and causing performance degradation, for example, due to photo-induced or thermal damage. In some embodiments, a blocking filter 112 may include a reflective dichroic filter configured to transmit one or more wavelengths of enhancing illumination 111 and reflect plasma radiation or configured to transmit plasma radiation and enhancing illumination 111. Alternatively or additionally, a blocking filter 112 may include an absorptive filter (e.g., a gold-coated mirror that efficiently absorbs UV or another selected spectral range). FIG. 4A illustrates an embodiment where the blocking filter 112 is configured to transmit enhancing illumination 111 toward the plasma 104 and is configured to block (e.g., reflect) at least a portion of the output illumination 115 (e.g., broadband plasma radiation) so that it does not reach the enhancing illumination source 108. Another embodiment is shown in FIG. 4B, where the blocking filter 112 is configured to reflect enhancing illumination 111 (e.g., to direct the enhancing illumination 111 toward the plasma 104), and the blocking filter 112 is configured to transmit at least a portion of the output illumination 115 (e.g., broadband plasma radiation) so that it does not reach the enhancing illumination source 108. In the FIG. 4B configuration, the blocking filter 112 may be configured to transmit the output illumination 115 (or a portion thereof) into a beam block 114 that absorbs the illumination or otherwise removes it from the system 100.

Figure 5A:
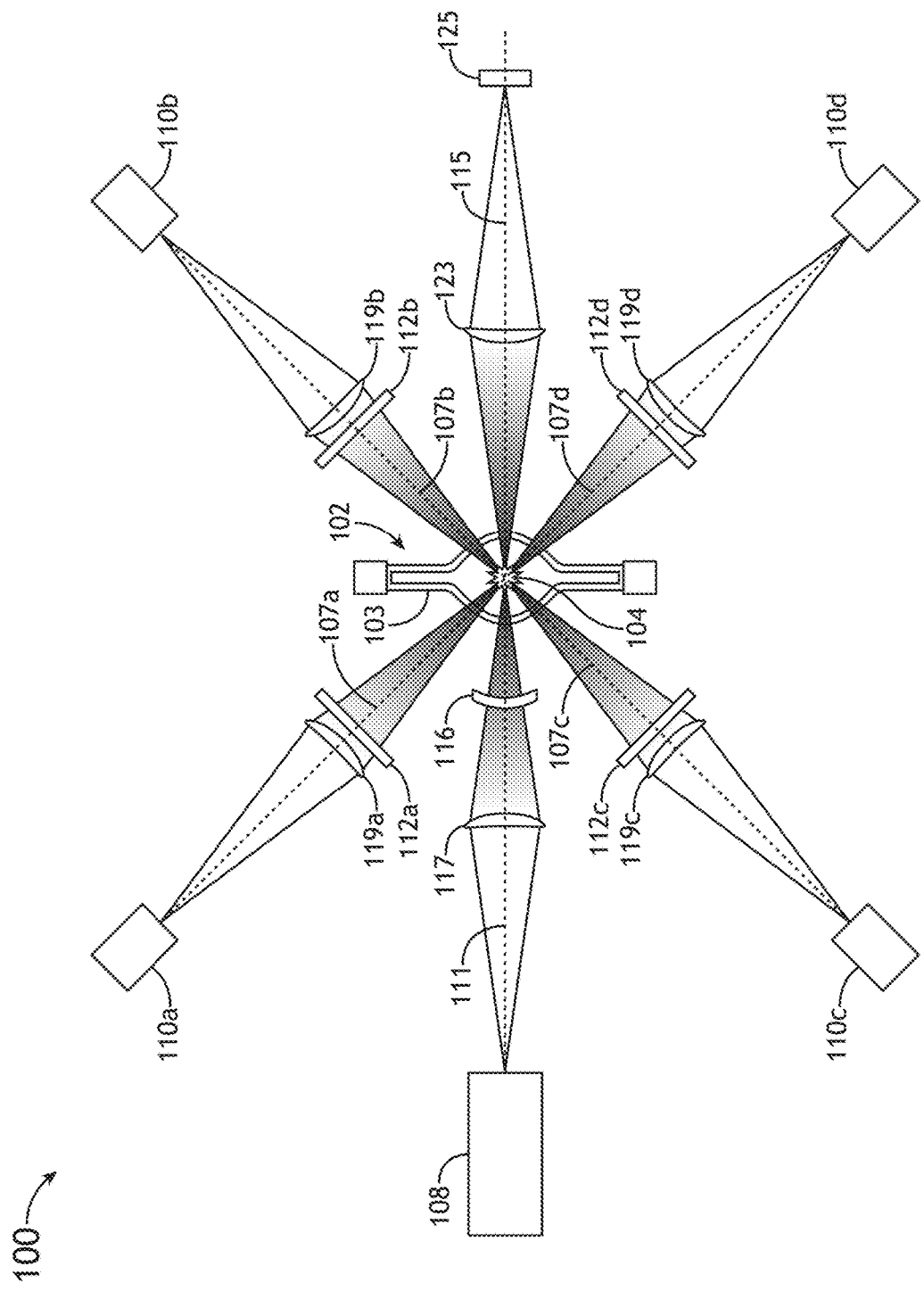
FIG. 5A is a schematic illustration of a LSP illumination system, such as the LSP illumination system illustrated in FIG. 3A, that includes a retro-reflective dichroic mirror configured to redirect at least a portion of the output illumination along the output illumination path, in accordance with one or more embodiments of the present disclosure.
Figure 5B:
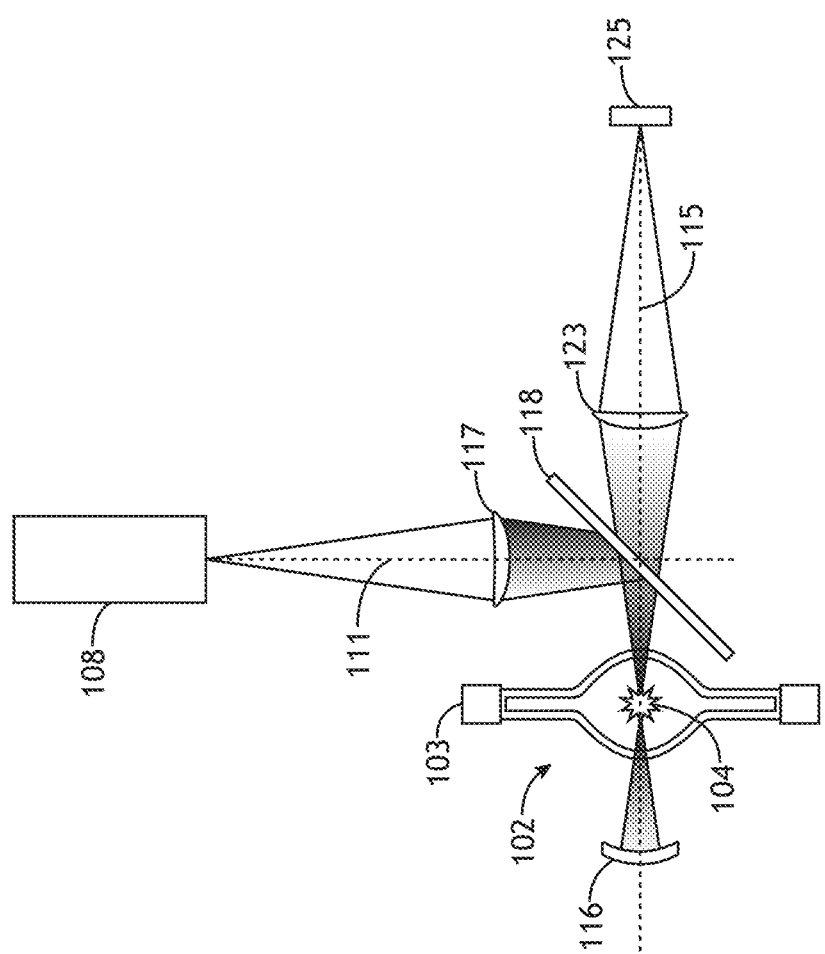
FIG. 5B is a schematic illustration of a portion of a LSP illumination system, such as the LSP illumination system illustrated in FIG. 5A, wherein the one or more enhancing illumination sources are configured to direct the enhancing illumination along a first illumination path that is non-collinear to the output illumination path, and wherein a dichroic mirror is configured to redirect the enhancing illumination from the first illumination path to an illumination path that is collinear to the output illumination path, in accordance with one or more embodiments of the present disclosure.

FIGS. 5A and 5B illustrate additional embodiments of the system 100, where the system 100 includes a retro-reflecting arrangement using reflective or transmissive dichroics. As shown in FIG. 5A, the system 100 may include a collector element 116 (e.g., an ellipsoidal or a spherical collector element) comprising retro-reflective dichroic mirror configured to redirect at least a portion of the output illumination 115 along the output illumination path. For example, the retro-reflective collector element 116 can be configured to transmit the one or more wavelengths of enhancing illumination 111 and configured to reflect at least a portion of the output/broadband illumination 115 generated by the plasma 104. One advantage of this configuration is that it allows for double-pass collection through the plasma 104, for example, as described in U.S. patent application Ser. No. 15/187,590, which is incorporated herein by reference in its entirety. The enhancing illumination source 108 in this configuration may be used with or without pump modules 110.

Another embodiment is shown in FIG. 5B, where the one or more enhancing illumination sources 108 are configured to direct the enhancing illumination 111 along a first illumination path that is non-collinear to the output illumination path, and a dichroic mirror 118 is configured to redirect the enhancing illumination 111 from the first illumination path to a second illumination path that is collinear to the output illumination path. In this configuration, the dichroic mirror 118 may be reflective (or partially reflective) for the enhancing illumination 111, while the collector element 116 is reflective for the enhancing illumination 111 and the broadband/output illumination 115. The collector element 116 can be configured to collect and focus the enhancing illumination 111 and the broadband illumination 115 to direct the combined output illumination 115 along the output illumination path. In this regard, the collector element 116 may be configured to reflect both the enhancing illumination 111 and the broadband illumination 115 generated by the plasma. In such an arrangement, the enhancing illumination 111 may have higher radiance since only a fraction of it will be collected. Most would be absorbed by the plasma and reflected by the dichroics. Thus, the enhancing illumination source 108 in this configuration may be used with or without pump modules 110. It is also possible to flip the orientation of the dichroic mirror 118 to inject the enhancing illumination 111 directly into the collector element 116.

FIGS. 3A through 5B illustrate embodiments of a system 100 for generating and/or maintaining a plasma 104 (e.g., LSP) with pump illumination 107 generated by the one or more pump modules 110. However, it is noted that the embodiments shown in FIGS. 3A through 5B are provided as examples of possible implementations, and the system 100 can also be implemented in accordance with any LSP light source configuration known in the art. Furthermore, the one or more pump modules 110 and/or one or more enhancing illumination sources 108 described herein can be implemented in any other LSP system architecture without departing from the scope of this disclosure.

Referring generally to FIGS. 3A through 5B, in embodiments, the system 100 includes a plasma site 102 (e.g. for generating, or maintaining, a plasma 104). The plasma site 102 may include, but is not limited to, a plasma cell, plasma bulb, chamber, drum, or the like. The plasma site 102 can be configured to contain or support plasma forming material 103 (e.g., a gas or gas mixture and/or liquid or solid plasma forming material). Focusing pump illumination 107 from the one or more pump modules 110 onto/into the plasma forming material 103 may cause energy to be absorbed through one or more selected absorption lines of the plasma forming material 103 or plasma 104 at the plasma site 102, thereby "pumping" the plasma forming material 103 in order to generate or sustain plasma 104. In some embodiments, although not shown, the plasma site 102 may include a set of electrodes for initiating the plasma 104 within the internal volume of the plasma site 102, whereby the pump illumination 107 from the one or more pump modules 110 maintains the plasma 104 after ignition by the electrodes. The plasma 104 may emit broadband illumination, for example, upon relaxation of gas species to a lower energy level.

In some embodiments, excimers may form within the volume of gas outside of the generated plasma 104 at temperatures suitable for generating and/or maintaining a bound excimer state (e.g. a bound molecular state associated with one or more components of the plasma forming material 103) representing an excited energy state of the molecule. Excimers may emit illumination in the ultraviolet spectrum upon relaxation (e.g. de-excitation, or the like) to a lower energy state of the excimer. De-excitation of an excimer may result in a dissociation of the excimer molecule. For example, $Ar_2^*$ excimers may emit at 126 nm, $Kr_2^*$ excimers may emit at 146 nm, and $Xe_2^*$ excimers may emit at 172 nm or 175 nm. It is noted that the spectral content of illumination emanating from the plasma site 102 may include spectral components associated with emission from the plasma 104 and/or one or more excimers within the plasma site 102.

In some embodiments, the system 100 includes one or more propagation elements configured to direct and/or process illumination emitted from the plasma site 102. For example, the one or more propagation elements may include, but are not limited to, transmissive elements (e.g. transparent portions of the plasma site 102, filters, and the like), reflective elements (e.g. mirrors to direct the broadband illumination 115, and the like), or focusing elements (e.g. illumination optics 119, collection optics 123, lenses, focusing mirrors, and the like).

It is noted herein that broadband emission 115 of plasma illumination is generally influenced by a multitude of factors including, but not limited to, the focused intensity of pump illumination 107 from the one or more pump modules 110, the temperature of the plasma forming material 103, the pressure of the plasma forming material 103, and/or the composition of the plasma forming material 103. Further, spectral content of broadband illumination 115 emitted by the plasma 104 and/or the plasma forming material 103 (e.g. one or more excimers within the plasma site 102) may include, but is not limited to, infrared (IR), visible (VIS), ultraviolet (UV), vacuum ultraviolet (VUV), deep ultraviolet (DUV), or extreme ultraviolet (EUV) wavelengths. In an embodiment, the plasma 104 emits visible and IR illumination with wavelengths in at least the range of 600 to 2000 nm. In another embodiment, the plasma 104 emits visible and UV illumination with wavelengths in at least the range of 200 to 600 nm. In another embodiment, the plasma 104 emits at least short-wavelength illumination having a wavelength below 200 nm. In a further embodiment, one or more excimers in the plasma site 102 emit UV and/or VUV illumination. It is noted herein that the present disclosure is not limited to the wavelength ranges described above and the plasma 104 and/or excimers in the plasma site 102 may emit illumination having wavelengths in one or any combination of the ranges provided above.

It is contemplated herein that the system 100 may be utilized to initiate and/or sustain a plasma 104 using a variety of plasma forming materials 103. In an embodiment, the plasma forming material 103 used to initiate and/or maintain the plasma 104 may include a noble gas, an inert gas (e.g., noble gas or non-noble gas) and/or a non-inert gas (e.g., mercury). In another embodiment, the plasma forming material 103 includes a mixture of a gas (e.g., noble gas, non-noble gases and the like) and one or more gaseous trace materials (e.g., metal halides, transition metals and the like). For example, gases suitable for implementation in the present disclosure may include, but are not limited, to Xe, Ar, Ne, Kr, He, $N_2$, $H_2O$, $O_2$, $H_2$, $D_2$, $F_2$, $CH_4$, metal halides, halogens, Hg, Cd, Zn, Sn, Ga, Fe, Li, Na, K, Tl, In, Dy, Ho, Tm, ArXe, ArHg, ArKr, ArRn, KrHg, XeHg, and the like. In a general sense, the present disclosure should be interpreted to extend to any LSP system and any type of gas mixture suitable for sustaining a plasma 104 at or within a plasma site 102.

The plasma site 102 may include any type of plasma site 102 known in the art suitable for initiating and/or maintaining a plasma 104. For example, in an embodiment, the plasma site 102 includes a plasma cell. The use of a plasma cell is described in at least U.S. Pat. No. 9,775,226, granted on Sep. 26, 2017; and U.S. Pat. No. 9,185,788, granted on Nov. 10, 2015, which are each incorporated herein by reference in the entirety. In another embodiment, the plasma site 102 includes a plasma bulb. The use of a plasma bulb is described in at least U.S. Pat. No. 7,786,455, granted on Aug. 31, 2010; and U.S. Pat. No. 9,318,311, granted on Apr. 19, 2016, which are each incorporated herein by reference in the entirety.

It is noted herein that the various optical elements (e.g., illumination optics 119, collection optics 123; and the like) may also be enclosed within the plasma site 102. In an embodiment, the plasma site 102 is a chamber suitable for containing a plasma forming material 103 and one or more optical components. For example, the use of a self-contained gas chamber is described in U.S. Pat. No. 9,099,292, granted on Aug. 4, 2015, which is incorporated herein by reference in the entirety.

In some embodiments, the plasma site 102 (e.g., plasma cell plasma bulb, chamber and the like) includes one or more transparent portions. The transparent portions can be formed from any material known in the art that is at least partially transparent to illumination generated by plasma 104. In an embodiment, the transparent portions may be formed from any material known in the art that is at least partially transparent to IR illumination, visible illumination and/or UV illumination 107 from the one or more pump modules 110. In another embodiment, the transparent portions may be formed from any material known in the art that is at least partially transparent to the broadband illumination 115 emitted from the plasma 104. In an embodiment, a plasma site 102 contains a plasma forming material 103 including one or more gas components to suppress wavelengths of illumination corresponding to an absorption spectrum of any of the transparent portions of the plasma site 102. With regard to this embodiment, benefits of the inhibition of undesired wavelengths by the plasma forming material 103 may include, but are not limited to, reduced damage, reduced solarization, or reduced heating of the transparent portion of the plasma site 102.

In some embodiments, the transparent portions of the plasma site 102 may be formed from a low-OH content fused silica glass material. In other embodiments, the transparent portions of the plasma site 102 may be formed from high-OH content fused silica glass material. For example, the transparent portion of the plasma site 102 may include, but is not limited to, SUPRASIL 1, SUPRASIL 2, SUPRASIL 300, SUPRASIL 310, HERALUX PLUS, HERALUX-VUV, and the like. In other embodiments, the transparent portion of the plasma site 102 may include, but is not limited to, $CaF_2$, $MgF_2$, LiF, crystalline quartz and sapphire. It is noted herein that materials such as, but not limited to, $CaF_2$, $MgF_2$, crystalline quartz and sapphire provide transparency to short-wavelength illumination (e.g., λ<190 nm). Various glasses suitable for implementation in the transparent portion of the plasma site 102 (e.g., chamber window, glass bulb, glass tube or transmission element) of the present disclosure are discussed in detail in A. Schreiber et al., Illumination Resistance of Quartz Glass for VUV Discharge Lamps, J. Phys. D: Appl. Phys. 38 (2005), 3242-3250, which is incorporated herein by reference in the entirety. It is noted herein that fused silica does provide some transparency to illumination having wavelength shorter than 190 nm, showing useful transparency to wavelengths as short as 170 nm.

The one or more transparent portions of the plasma site 102 may take on any shape known in the art. In an embodiment, the transparent may have a cylindrical shape. In another embodiment, the transparent portion may have a spherical shape. In another embodiment, the transparent portion may have a composite shape. For example, the shape of the transparent portion may comprise a combination of two or more shapes.

In some embodiments, the system 100 may include a collector element (e.g., an ellipsoidal or a spherical collector element) configured to focus illumination emanating from the one or more pump modules 110 into a volume of a plasma forming material 103 contained within the plasma site 102. In embodiments, the collector element is arranged to collect broadband illumination 115 emitted by plasma 104 and direct the broadband illumination 115 to one or more additional optical elements (e.g., collection optics 123, one or more filters, homogenizer 125, and the like). It is noted that the above configuration is not a limitation on the scope of the present disclosure. For example, the system 100 may include one or more reflector and/or focus optics for focusing and/or directing illumination from one or more pump modules 110 into the volume of the plasma forming material 103 and a separate set of collection optics for collecting broadband illumination 115 emitted by the plasma 104. For example, an optical configuration including separate reflector optics and collection optics is described in U.S. Patent Publication No. 2016/0381776, published on Dec. 29, 2016, which is incorporated herein by reference in the entirety.

The collector element may take on any physical configuration known in the art suitable for focusing illumination emanating from the one or more pump modules 110 into or onto the plasma forming material 103. In some embodiments, the collector element may include a concave region with a reflective internal surface suitable for receiving illumination 107 from the one or more pump modules 110 and focusing the illumination 107 into the volume of plasma forming material 103 contained within the plasma site 102. For example, the collector element may include an ellipsoid-shaped collector element having a reflective internal surface. As another example, the collector element may include a spherical-shaped collector element having a reflective internal surface.

In some embodiments, a collector element (e.g., collector element 116) collects broadband illumination 115 emitted by plasma 104 and directs the broadband illumination 115 to one or more downstream optical elements. For example, the one or more downstream optical elements may include, but are not limited to, collection optics 123 (e.g., focusing elements, filters, etc.), a homogenizer 125, and the like. In some embodiments, the collector element may collect broadband illumination 115 including EUV, DUV, VUV, UV, visible and/or infrared illumination emitted by plasma 104 and direct the broadband illumination to one or more downstream optical elements. In this regard, the plasma site 102 may deliver EUV, DUV, VUV, UV, visible, and/or infrared illumination to downstream optical elements of any optical characterization system known in the art, such as, but not limited to, an inspection tool or a metrology tool. For example, the LSP system 100 may serve as an illumination sub-system, or illuminator, for a broadband inspection tool (e.g., wafer or reticle inspection tool), a metrology tool or a photolithography tool. It is noted herein the plasma site 102 of system 100 may emit useful illumination in a variety of spectral ranges including, but not limited to, EUV, DUV illumination, VUV illumination, UV illumination, visible illumination, and infrared illumination.

In some embodiments, the system 100 may include various additional optical elements. For example, additional optics may include collection optics configured to collect broadband illumination emanating from the plasma 104. For instance, the system 100 may include a cold mirror (e.g. operating as a beam splitter, a sampler, or the like) arranged to direct illumination from a collector element to downstream optics, such as, but not limited to, a homogenizer 125.

In some embodiments, the system 100 may include one or more additional lenses placed along either the illumination pathway or the collection pathway of system 100. The one or more lenses may be utilized to focus illumination from the one or more pump modules 110 into the volume of plasma forming material 103. Alternatively, the one or more additional lenses may be utilized to focus broadband illumination emitted by the plasma 104 onto a selected target (not shown).

It is noted herein that the set of optics of system 100 as described above and illustrated in FIGS. 3A through 5B are provided for illustration and should not be interpreted as limiting. It is contemplated that a number of equivalent optical configurations may be utilized within the scope of the present disclosure.

Figure 6:
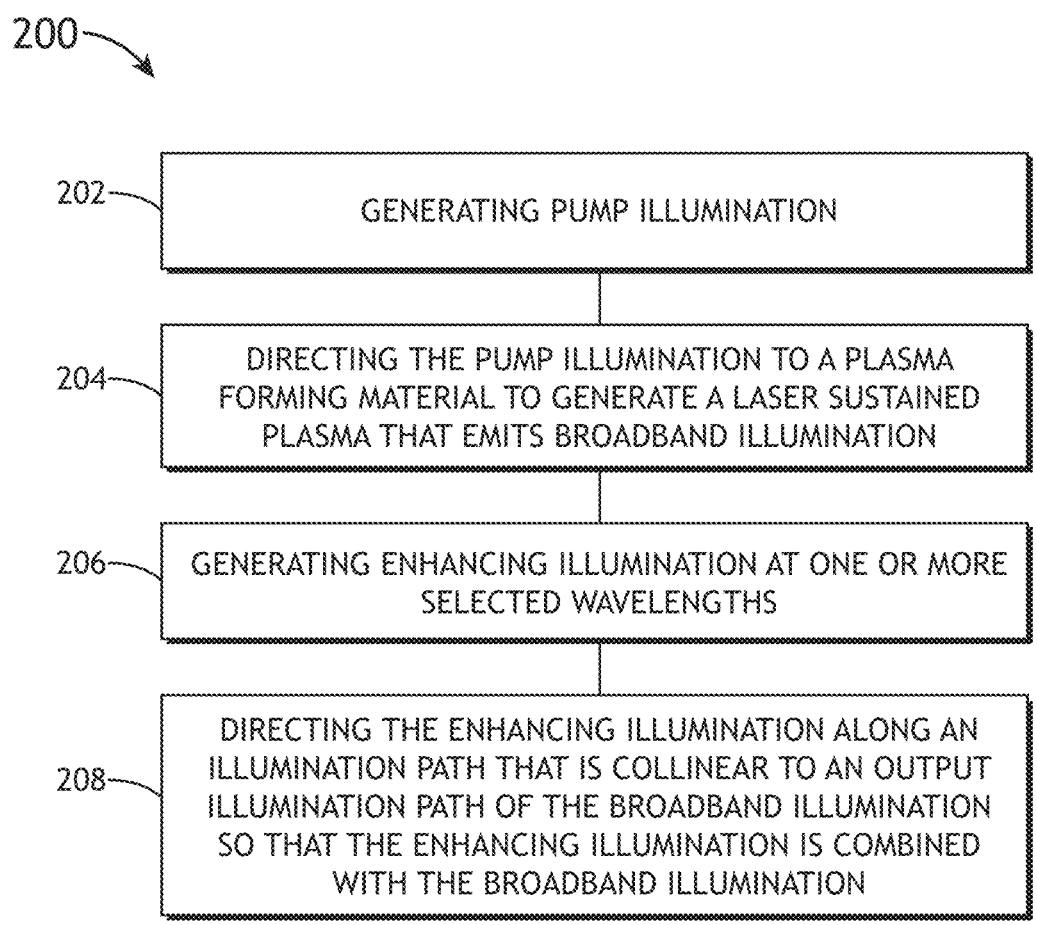
FIG. 6 is a flow diagram illustrating method for generating broadband illumination, in accordance with one or more implementations of the present disclosure.

FIG. 6 is a flow diagram illustrating one or more implementations of a method 200 for generating broadband illumination 115 with a system, such as system 100, that employs one or more pump modules 110 and one or more enhancing illumination sources 108. At step 202, pump illumination 107 is generated by one or more pump modules 110. At step 204, the pump illumination 107 is directed to a plasma forming material to generate a plasma 104 that emits broadband illumination 115. In implementations, the pump illumination 107 is directed along one or more pump illumination paths that are non-collinear to an output illumination path of the broadband illumination 115. At step 206, enhancing illumination 111 is generated by one or more enhancing illumination sources 108 configured to output one or more selected wavelengths/bands of illumination. At step 208, the enhancing illumination 111 is directed along an illumination path that is collinear to the output illumination path of the broadband illumination 115 so that the enhancing illumination 111 is combined with the broadband illumination 115, thereby enhancing the broadband illumination 115 at the one or more selected wavelengths.

It is noted that the embodiments and enabling technologies described previously herein in the context of system 100 should be interpreted to extend to method 200. In this regard, the steps of method 200 may be carried out by system 100, and the method 200 may further include one or more steps required or implied by the architecture of system 100. However, the method 200 is not limited to the architecture of system 100, and it is recognized that one or more steps of method 200, or portions thereof, may be carried out with alternative system components and/or architecture. Furthermore, the steps of method 200 can be carried out in any order unless otherwise specified herein.

Figure 7:
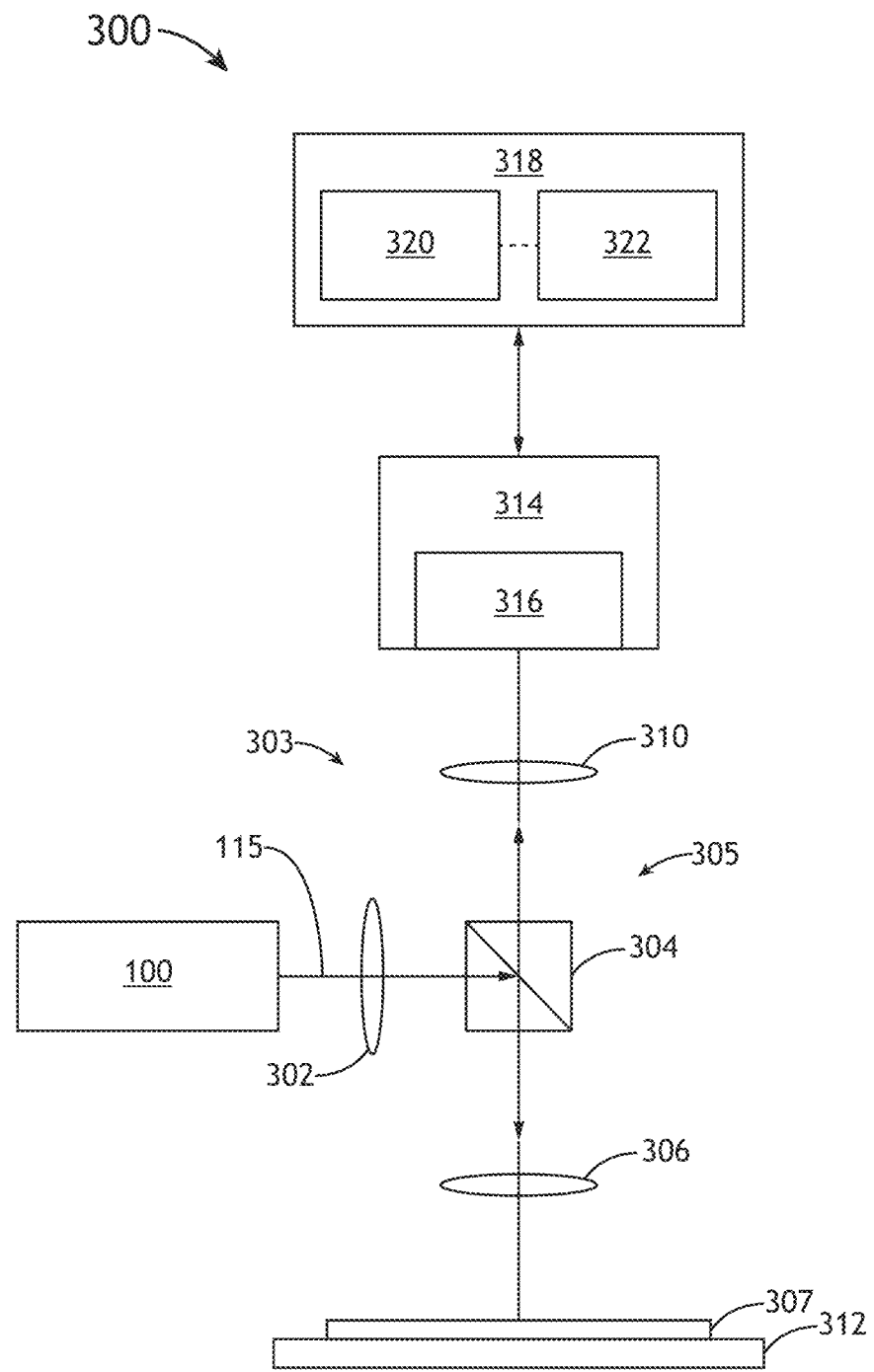
FIG. 7 is schematic illustration of an optical characterization system implementing a LSP illumination source, such as the LSP illumination system illustrated in any of FIGS. 1 through 5B, or any combination thereof, in accordance with one or more embodiments of the present disclosure.

FIG. 7 illustrates a simplified schematic view of an optical characterization system 300 implementing the LSP illumination system 100, in accordance with one or more embodiments of the present disclosure. In one embodiment, system 300 includes the LSP illumination system 100, an illumination arm 303, a collection arm 305, a detector assembly 314, and a controller 318 including one or more processors 320 and memory 322.

It is noted herein that system 300 may comprise any imaging, inspection, metrology, lithography, or other characterization system known in the art. In this regard, system 300 may be configured to perform inspection, optical metrology, lithography, and/or any form of imaging on a specimen 307. Specimen 307 may include any sample known in the art including, but not limited to, a wafer, a reticle/photomask, and the like. It is noted that system 300 may incorporate one or more of the various embodiments of the LSP illumination system 100 described throughout the present disclosure.

In one embodiment, specimen 307 is disposed on a stage assembly 312 to facilitate movement of specimen 307. Stage assembly 312 may include any stage assembly 312 known in the art including, but not limited to, an X-Y stage, an R-θ stage, and the like. In another embodiment, stage assembly 312 is capable of adjusting the height of specimen 307 during inspection or imaging to maintain focus on the specimen 307.

In another embodiment, the illumination arm 303 is configured to direct illumination 115 from the LSP illumination system 100 to the specimen 307. The illumination arm 303 may include any number and type of optical components known in the art. In one embodiment, the illumination arm 303 includes one or more optical elements 302, a beam splitter 304, and an objective lens 306. In this regard, illumination arm 303 may be configured to focus illumination 115 from the LSP illumination system 100 onto the surface of the specimen 307. The one or more optical elements 302 may include any optical element or combination of optical elements known in the art including, but not limited to, one or more mirrors, one or more lenses, one or more polarizers, one or more gratings, one or more filters, one or more beam splitters, and the like.

In another embodiment, the collection arm 305 is configured to collect light reflected, scattered, diffracted, and/or emitted from specimen 307. In another embodiment, collection arm 305 may direct and/or focus the light from the specimen 307 to a sensor 316 of a detector assembly 314. It is noted that sensor 316 and detector assembly 314 may include any sensor and detector assembly known in the art. The sensor 316 may include, but is not limited to, a charge-coupled device (CCD) detector, a complementary metal-oxide semiconductor (CMOS) detector, a time-delay integration (TDI) detector, a photomultiplier tube (PMT), an avalanche photodiode (APD), and the like. Further, sensor 316 may include, but is not limited to, a line sensor or an electron-bombarded line sensor.

In another embodiment, detector assembly 314 is communicatively coupled to a controller 318 including one or more processors 320 and memory 322. For example, the one or more processors 320 may be communicatively coupled to memory 322, wherein the one or more processors 320 are configured to execute a set of program instructions stored on memory 322. In one embodiment, the one or more processors 320 are configured to analyze the output of detector assembly 314. In one embodiment, the set of program instructions are configured to cause the one or more processors 320 to analyze one or more characteristics of specimen 307. In another embodiment, the set of program instructions are configured to cause the one or more processors 320 to modify one or more characteristics of system 300 in order to maintain focus on the specimen 307 and/or the sensor 316. For example, the one or more processors 320 may be configured to adjust the objective lens 306 or one or more optical elements 302 in order to focus illumination 115 from LSP illumination system 100 onto the surface of the specimen 307. By way of another example, the one or more processors 320 may be configured to adjust the objective lens 306 and/or one or more optical elements 310 in order to collect illumination from the surface of the specimen 307 and focus the collected illumination on the sensor 316.

It is noted that the system 300 may be configured in any optical configuration known in the art including, but not limited to, a dark-field configuration, a bright-field orientation, and the like.

It is noted herein that the one or more components of system 100 may be communicatively coupled to the various other components of system 100 in any manner known in the art. For example, the LSP illumination system 100, detector assembly 314, controller 318, and one or more processors 320 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

Figure 8:
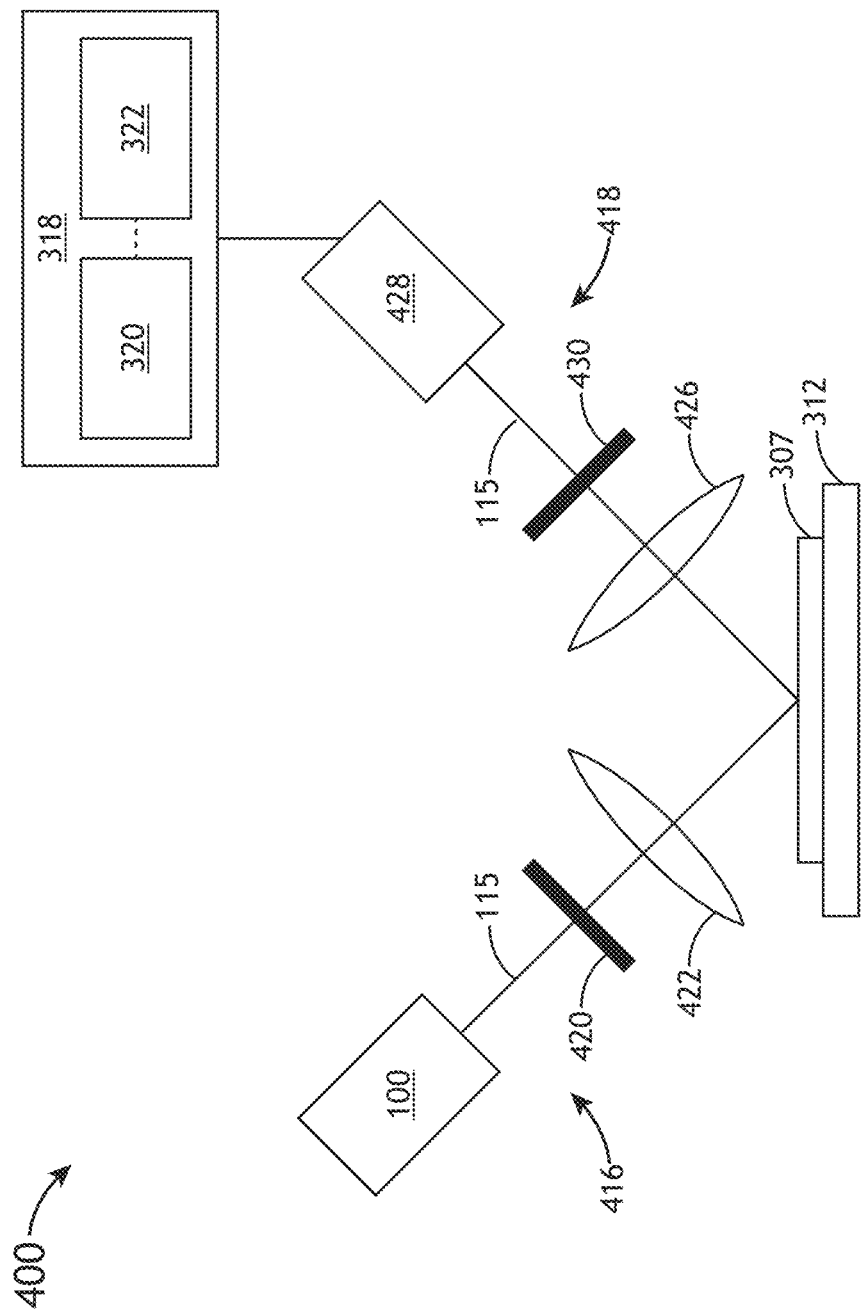
FIG. 8 is a schematic illustration of an optical characterization system implementing a LSP illumination source, such as the LSP illumination system illustrated in any of FIGS. 1 through 5B, or any combination thereof, in accordance with one or more embodiments of the present disclosure.

FIG. 8 illustrates a simplified schematic diagram of an optical characterization system 400 arranged in a reflectometry and/or ellipsometry configuration, in accordance with one or more embodiments of the present disclosure. It is noted that the various embodiments and components described with respect to FIG. 7 may be interpreted to extend to the system of FIG. 8. The system 400 may include any type of metrology system known in the art.

In one embodiment, system 400 includes the LSP illumination system 100, an illumination arm 416, a collection arm 418, a detector assembly 428, and the controller 318 including the one or more processors 320 and memory 322.

In this embodiment, the broadband illumination 115 from the LSP illumination source is directed to the specimen 307 via the illumination arm 416. In another embodiment, the system 400 collects illumination emanating from the sample via the collection arm 418. The illumination arm pathway 416 may include one or more beam conditioning components 420 suitable for modifying and/or conditioning the broadband beam 115. For example, the one or more beam conditioning components 420 may include, but are not limited to, one or more polarizers, one or more filters, one or more beam splitters, one or more diffusers, one or more homogenizers, one or more apodizers, one or more beam shapers, or one or more lenses.

In another embodiment, the illumination arm 416 may utilize a first focusing element 422 to focus and/or direct the beam 115 onto the specimen 307 disposed on the sample stage 312. In another embodiment, the collection arm 418 may include a second focusing element 426 to collect illumination from the specimen 307.

In another embodiment, the detector assembly 428 is configured to capture illumination emanating from the specimen 307 through the collection arm 418. For example, the detector assembly 428 may receive illumination reflected or scattered (e.g., via specular reflection, diffuse reflection, and the like) from the specimen 307. By way of another example, the detector assembly 428 may receive illumination generated by the specimen 307 (e.g., luminescence associated with absorption of the beam 115, and the like). It is noted that detector assembly 428 may include any sensor and detector assembly known in the art. The sensor may include, but is not limited to, CCD detector, a CMOS detector, a TDI detector, a PMT, an APD, and the like.

The collection arm 418 may further include any number of collection beam conditioning elements 430 to direct and/or modify illumination collected by the second focusing element 426 including, but not limited to, one or more lenses, one or more filters, one or more polarizers, or one or more phase plates.

The system 400 may be configured as any type of metrology tool known in the art such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer.

A description of an inspection/metrology tools suitable for implementation in the various embodiments of the present disclosure are provided in U.S. patent application Ser. No. 13/554,954, entitled "Wafer Inspection," filed on Jul. 9, 2012; U.S. Published Patent Application 2009/0180176, entitled "Split Field Inspection System Using Small Catadioptric Objectives," published on Jul. 16, 2009; U.S. Published Patent Application 2007/0002465, entitled "Beam Delivery System for Laser Dark-Field Illumination in a Catadioptric Optical System," published on Jan. 4, 2007; U.S. Pat. No. 5,999,310, entitled "Ultra-broadband UV Microscope Imaging System with Wide Range Zoom Capability," issued on Dec. 7, 1999; U.S. Pat. No. 7,525,649 entitled "Surface Inspection System Using Laser Line Illumination with Two Dimensional Imaging," issued on Apr. 28, 2009; U.S. Published Patent Application 2013/0114085, entitled "Dynamically Adjustable Semiconductor Metrology System," by Wang et al. and published on May 9, 2013; U.S. Pat. No. 5,608,526, entitled "Focused Beam Spectroscopic Ellipsometry Method and System, by Piwonka-Corle et al., issued on Mar. 4, 1997; and U.S. Pat. No. 6,297,880, entitled "Apparatus for Analyzing Multi-Layer Thin Film Stacks on Semiconductors," by Rosencwaig et al., issued on Oct 2, 2001, which are each incorporated herein by reference in their entirety.

The one or more processors 320 of the present disclosure may include any one or more processing elements known in the art. In this sense, the one or more processors 320 may include any microprocessor-type device configured to execute software algorithms and/or instructions. It should be recognized that the steps described throughout the present disclosure may be carried out by a single computer system or, alternatively, multiple computer systems. In general, the term "processor" may be broadly defined to encompass any device having one or more processing and/or logic elements, which execute program instructions from a non-transitory memory medium 322. Moreover, different subsystems of the various systems disclosed may include processor and/or logic elements suitable for carrying out at least a portion of the steps described throughout the present disclosure.

The memory medium 322 may include any storage medium known in the art suitable for storing program instructions executable by the associated one or more processors 320. For example, the memory medium 322 may include a non-transitory memory medium. For instance, the memory medium 322 may include, but is not limited to, a read-only memory, a random-access memory, a magnetic or optical memory device (e.g., disk), a magnetic tape, a solid-state drive, and the like. In another embodiment, the memory 322 is configured to store one or more results and/or outputs of the various steps described herein. It is further noted that memory 322 may be housed in a common controller housing with the one or more processors 320. In an alternative embodiment, the memory 322 may be located remotely with respect to the physical location of the one or more processors 320. For instance, the one or more processors 320 may access a remote memory (e.g., server), accessible through a network (e.g., internet, intranet, and the like). In this regard, the one or more processors 320 of the controller 318 may execute any of the various process steps described throughout the present disclosure.

In some embodiments, the LSP illumination system 100 and systems 300, 400, as described herein, may be configured as a "stand alone tool," interpreted herein as a tool that is not physically coupled to a process tool. In other embodiments, such an inspection or metrology system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection or measurement performed by the systems described herein may be used to alter a parameter of a process or a process tool using a feedback control technique, a feedforward control technique, and/or an in-situ control technique. The parameter of the process or the process tool may be altered manually or automatically.

The embodiments of the LSP illumination system 100 and systems 300, 400 may be further configured as described herein. In addition, the LSP illumination system 100 and systems 300, 400 may be configured to perform any other step(s) of any of the method implementation(s) (e.g., method 200) described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for pumping laser sustained plasma and enhancing one or more selected wavelengths of output illumination generated by the laser sustained plasma, the system comprising:
    one or more pump modules configured to generate pump illumination for the laser sustained plasma, the pump illumination directed along one or more pump illumination paths that are non-collinear to an output illumination path of the output illumination; and
    one or more enhancing illumination sources configured to generate enhancing illumination at one or more selected wavelengths, the enhancing illumination directed along an illumination path that is collinear to the output illumination path of the output illumination so that the enhancing illumination is combined with the output illumination, thereby enhancing the output illumination at the one or more selected wavelengths.

2. The system of claim 1, wherein the one or more selected wavelengths include one or more wavelengths in the infrared spectrum.

3. The system of claim 1, wherein the one or more selected wavelengths include one or more wavelengths in range of 600 nm to 2000 nm.

4. The system of claim 1, wherein the one or more enhancing illumination sources include a multi-wavelength illumination source.

5. The system of claim 1, wherein the one or more enhancing illumination sources include a plurality of single or multiple wavelength illumination sources coupled into a common optical fiber.

6. The system of claim 1, wherein the one or more enhancing illumination sources include a plurality of single or multiple wavelength illumination sources combined onto dichroic optics or in numerical aperture space.

7. The system of claim 1, wherein the one or more enhancing illumination sources include at least one of a continuous wave laser, a pulsed laser, a free-standing laser, a supercontinuum laser, or a separate laser sustained plasma light source.

8. The system of claim 1, wherein the enhancing illumination is lower intensity than the pump illumination.

9. The system of claim 1, wherein the one or more enhancing illumination sources are further configured to pump the laser sustained plasma with the enhancing illumination.

10. The system of claim 1, wherein the one or more pump modules include one or more laser light sources.

11. The system of claim 10, wherein at least one laser light source of the one or more laser light sources includes at least one of a diode laser, a fiber laser, a fiber-coupled diode laser, or a free-range laser.

12. The system of claim 1, further comprising one or more optical elements configured to direct the pump illumination to the laser sustained plasma.

13. The system of claim 12, wherein the one or more optical elements include optics configured to shape the pump illumination and focus the pump illumination into the laser sustained plasma or in proximity to the laser sustained plasma.

14. The system of claim 1, further comprising one or more optical elements configured to direct the enhancing illumination to the output illumination path.

15. The system of claim 14, wherein the one or more optical elements include optics configured to shape the pump illumination and focus the pump illumination into the laser sustained plasma or in proximity to the laser sustained plasma.

16. The system of claim 1, further comprising:
one or more blocking filters configured to prevent at least a portion of the output illumination from being redirected to the one or more pump modules or to the one or more enhancing illumination sources.

17. The system of claim 16, wherein at least one of the one or more blocking filters includes at least one of a dichroic mirror or an absorptive filter.

18. The system of claim 1, further comprising:
a retro-reflective dichroic mirror configured to redirect at least a portion of the output illumination along the output illumination path.

19. The system of claim 18, wherein the one or more enhancing illumination sources are configured to direct the enhancing illumination along a first illumination path that is non-collinear to the output illumination path, and wherein a dichroic mirror is configured to redirect the enhancing illumination from the first illumination path to the illumination path that is collinear to the output illumination path.

20. A system for generating broadband illumination, comprising:
a plasma forming material;
one or more pump modules configured to generate pump illumination; and
one or more optical elements configured to direct the pump illumination to the plasma forming material, whereby the pump illumination causes the plasma forming material to generate a laser sustained plasma that emits broadband illumination, wherein the pump illumination is directed along one or more pump illumination paths that are non-collinear to an output illumination path of the broadband illumination; and
one or more enhancing illumination sources configured to generate enhancing illumination at one or more selected wavelengths, the enhancing illumination directed along an illumination path that is collinear to the output illumination path of the broadband illumination so that the enhancing illumination is combined with the broadband illumination, thereby enhancing the broadband illumination at the one or more selected wavelengths.

21. The system of claim 20, wherein the one or more selected wavelengths include one or more wavelengths in the infrared spectrum.

22. The system of claim 20, wherein the one or more selected wavelengths include one or more wavelengths in range of 600 nm to 2000 nm.

23. The system of claim 20, wherein the one or more enhancing illumination sources include a multi-wavelength illumination source.

24. The system of claim 20, wherein the one or more enhancing illumination sources include a plurality of single or multiple wavelength illumination sources coupled into a common optical fiber.

25. The system of claim 20, wherein the one or more enhancing illumination sources include a plurality of single or multiple wavelength illumination sources combined onto dichroic optics or in numerical aperture space.

26. The system of claim 20, wherein the one or more enhancing illumination sources include at least one of a continuous wave laser, a pulsed laser, a free-standing laser, a supercontinuum laser, or a separate laser sustained plasma light source.

27. The system of claim 20, wherein the enhancing illumination is lower intensity than the pump illumination.

28. The system of claim 20, wherein the one or more enhancing illumination sources are further configured to pump the laser sustained plasma with the enhancing illumination.

29. The system of claim 20, wherein the one or more pump modules include one or more laser light sources.

30. The system of claim 29, wherein at least one laser light source of the one or more laser light sources includes at least one of a diode laser, a fiber laser, a fiber-coupled diode laser, or a free-range laser.

31. The system of claim 20, wherein the one or more optical elements are configured to direct the pump illumination to the laser sustained plasma.

32. The system of claim 31, wherein the one or more optical elements include optics configured to shape the pump illumination and focus the pump illumination into the laser sustained plasma or in proximity to the laser sustained plasma.

33. The system of claim 20, wherein the one or more optical elements are configured to direct the enhancing illumination to the output illumination path.

34. The system of claim 33, wherein the one or more optical elements include optics configured to shape the pump illumination and focus the pump illumination into the laser sustained plasma or in proximity to the laser sustained plasma.

35. The system of claim 20, further comprising:
one or more blocking filters configured to prevent at least a portion of the broadband illumination from being redirected to the one or more pump modules or to the one or more enhancing illumination sources.

36. The system of claim 35, wherein the one or more blocking filters include at least one of a dichroic mirror or an absorptive filter.

37. The system of claim 20, further comprising:
a retro-reflective dichroic mirror configured to redirect at least a portion of the broadband illumination along the output illumination path.

38. The system of claim 37, wherein the one or more enhancing illumination sources are configured to direct the enhancing illumination along a first illumination path that is non-collinear to the output illumination path, and wherein a dichroic mirror is configured to redirect the enhancing illumination from the first illumination path to the illumination path that is collinear to the output illumination path.

39. The system of claim 20, further comprising one or more collection optics configured to receive the broadband illumination and direct the broadband illumination to an output.

40. The system of claim 39, wherein the output comprises an illuminator output for at least one of a metrology system or an inspection system.

41. A method of generating broadband illumination, comprising:
generating pump illumination with one or more pump modules;
directing the pump illumination to a plasma forming material, whereby the pump illumination causes the plasma forming material to generate a laser sustained plasma that emits broadband illumination, wherein the pump illumination is directed along one or more pump illumination paths that are non-collinear to an output illumination path of the broadband illumination;

generating enhancing illumination at one or more selected wavelengths with one or more enhancing illumination sources; and directing the enhancing illumination along an illumination path that is collinear to the output illumination path of the broadband illumination so that the enhancing illumination is combined with the broadband illumination, thereby enhancing the broadband illumination at the one or more selected wavelengths.

42. The method of claim 41, wherein the one or more selected wavelengths include one or more wavelengths in the infrared spectrum.

43. The method of claim 41, wherein the one or more selected wavelengths include one or more wavelengths in range of 600 nm to 2000 nm.

44. The method of claim 41, wherein the enhancing illumination is lower intensity than the pump illumination.

* * * * *